(12) United States Patent
Hirao

(10) Patent No.: US 12,107,019 B2
(45) Date of Patent: Oct. 1, 2024

(54) RANDOM CHARACTERISTIC EVALUATION OF SUBJECT MAPS

(71) Applicant: KABUSHIKI KAISHA TOSHIBA, Minato-ku (JP)

(72) Inventor: Shun Hirao, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 964 days.

(21) Appl. No.: 17/000,528

(22) Filed: Aug. 24, 2020

(65) Prior Publication Data
US 2021/0210393 A1 Jul. 8, 2021

(30) Foreign Application Priority Data
Jan. 7, 2020 (JP) .................................. 2020-000828

(51) Int. Cl.
    *G06F 17/18* (2006.01)
    *G01R 31/28* (2006.01)
    (Continued)

(52) U.S. Cl.
    CPC .......... *H01L 22/20* (2013.01); *G01R 31/2831* (2013.01); *G01R 31/318511* (2013.01);
    (Continued)

(58) Field of Classification Search
CPC ..... H01L 22/20; H01L 22/00; G01R 31/2831; G01R 31/318511; G06F 17/18; G06F 11/008
See application file for complete search history.

(56) References Cited

U.S. PATENT DOCUMENTS

| | | | | |
|---|---|---|---|---|
| 2009/0105990 A1* | 4/2009 | Shibuya | ............... | G01N 21/956 702/183 |
| 2014/0189612 A1* | 7/2014 | Douskey | ............ | G01R 31/3193 716/52 |
| 2019/0347277 A1 | 11/2019 | Tao et al. | | |

FOREIGN PATENT DOCUMENTS

| | | |
|---|---|---|
| JP | 2018195643 A * | 12/2018 |
| JP | 2019-197355 A | 11/2019 |

OTHER PUBLICATIONS

Sumikawa et al. (A Pattern Mining Framework for Inter-Wafer Abnormality Analysis, 2013 IEEE International Test Conference (ITC), Anaheim, CA, USA, 2013, pp. 1-10, doi: 10.1109/TEST.2013.6651890) (Year: 2013).*

(Continued)

*Primary Examiner* — Manish S Shah
*Assistant Examiner* — Christian T Bryant
(74) *Attorney, Agent, or Firm* — Oblon, McClelland, Maier & Neustadt, L.L.P.

(57) ABSTRACT

According to an embodiment, an information processing apparatus includes one or more processors. The processors are configured to: generate a plurality of shuffle maps obtained by randomly shuffling, from positions to others, at least some of subject values contained in a subject map having the subject values arrayed in N dimensions (N is an integer of 1 or more); generate a subject vector expressing features of a frequency domain of the subject map and random vectors expressing features of respective frequency domains of the shuffle maps; and derive, as an evaluation value for whether the subject map has a random characteristic, a testing result of statistical hypothesis testing on feature differences between the subject vector and the respective random vectors.

11 Claims, 10 Drawing Sheets

(51) Int. Cl.
*G01R 31/3185* (2006.01)
*H01L 21/66* (2006.01)
*G06F 11/00* (2006.01)

(52) U.S. Cl.
CPC ............ *G06F 17/18* (2013.01); *G06F 11/008* (2013.01); *H01L 22/00* (2013.01)

(56) References Cited

OTHER PUBLICATIONS

Nakata. K. et al., "A Comprehensive Big-Data-Based Monitoring System for Yield Enhancement in Semiconductor Manufacturing," IEEE Transactions on Semiconductor Manufacturing, vol. 30, No. 4, Nov. 2017, 6 pages.

* cited by examiner

FIG.2

| LABEL | RANDOM (NON-DEFECTIVE) | SMALL CENTER | LARGE CENTER | CENTER RING | UPPER AND LOWER MIDDLES | LOWER MIDDLE |
|---|---|---|---|---|---|---|
| DEFECTIVE WAFER EXAMPLES | 20A (20) | 20B (20) | 20C (20) | 20D (20) | 20E (20) | 20F (20) |
| NUMBER OF WAFERS | 3438 | 451 | 192 | 45 | 46 | 426 |
| RATIO | 64.9% | 8.5% | 3.6% | 0.8% | 0.9% | 8.0% |

| LABEL | LEFT LOWER MIDDLE | UPPER MIDDLE | UPPER CIRCUMFERENCE | RIGHT LOWER CIRCUMFERENCE | LOWER CIRCUMFERENCE | OUTERMOST UPPER CIRCUMFERENCE |
|---|---|---|---|---|---|---|
| DEFECTIVE WAFER EXAMPLES | 20G (20) | 20H (20) | 20I (20) | 20J (20) | 20K (20) | 20L (20) |
| NUMBER OF WAFERS | 58 | 32 | 160 | 44 | 87 | 316 |
| RATIO | 1.1% | 0.6% | 3.0% | 0.8% | 1.6% | 6.0% |

RANDOM CHARACTERISTIC EVALUATION OF SUBJECT MAPS

CROSS-REFERENCE TO RELATED APPLICATIONS

This application is based upon and claims the benefit of priority from Japanese Patent Application No. 2020-000828, filed on Jan. 7, 2020; the entire contents of which are incorporated herein by reference.

FIELD

An embodiment described herein relates generally to an information processing apparatus and an information processing method.

BACKGROUND

Techniques are known by which maps each having subject values arrayed in two dimensions are classified in accordance with patterns in the maps. For example, a technique is known by which feature tendencies of each map expressing inspection results of a semiconductor wafer are identified and the maps are classified according to the feature tendencies.

However, there is a map that exhibits a random characteristic such that features of the map are substantially unchanged even when the subject values are randomly shuffled from positions to others. For example, inspection results that indicate "defective" are caused by incidental factors such as a dust-related factor, and the probability of having such a result at each position is uniform on a semiconductor wafer regardless of where the position is. In such a case, a map that exhibits the random characteristic may be acquired. It is difficult to identify the feature tendencies of a map that has such a random characteristic. It has been therefore difficult to highly precisely classify, with a conventional technique that uses the feature tendencies of maps themselves as evaluation values, maps that have the random characteristic. That is, the conventional technique may fail to provide evaluation values that enable highly precise evaluation of whether a subject map has the random characteristic.

BRIEF DESCRIPTION OF THE DRAWINGS

FIG. 2 illustrates schematic illustrations of subject maps.

DETAILED DESCRIPTION

According to an embodiment, an information processing apparatus includes one or more processors. The processors are configured to: generate a plurality of shuffle maps obtained by randomly shuffling, from positions to others, at least some of subject values contained in a subject map having the subject values arrayed in N dimensions (N is an integer of 1 or more); generate a subject vector expressing features of a frequency domain of the subject map and random vectors expressing features of respective frequency domains of the shuffle maps; and derive, as an evaluation value for whether the subject map has a random characteristic, a testing result of statistical hypothesis testing on feature differences between the subject vector and the respective random vectors.

The following describes an information processing apparatus and an information processing method in detail with reference to the accompanying drawings.

Figure 1:
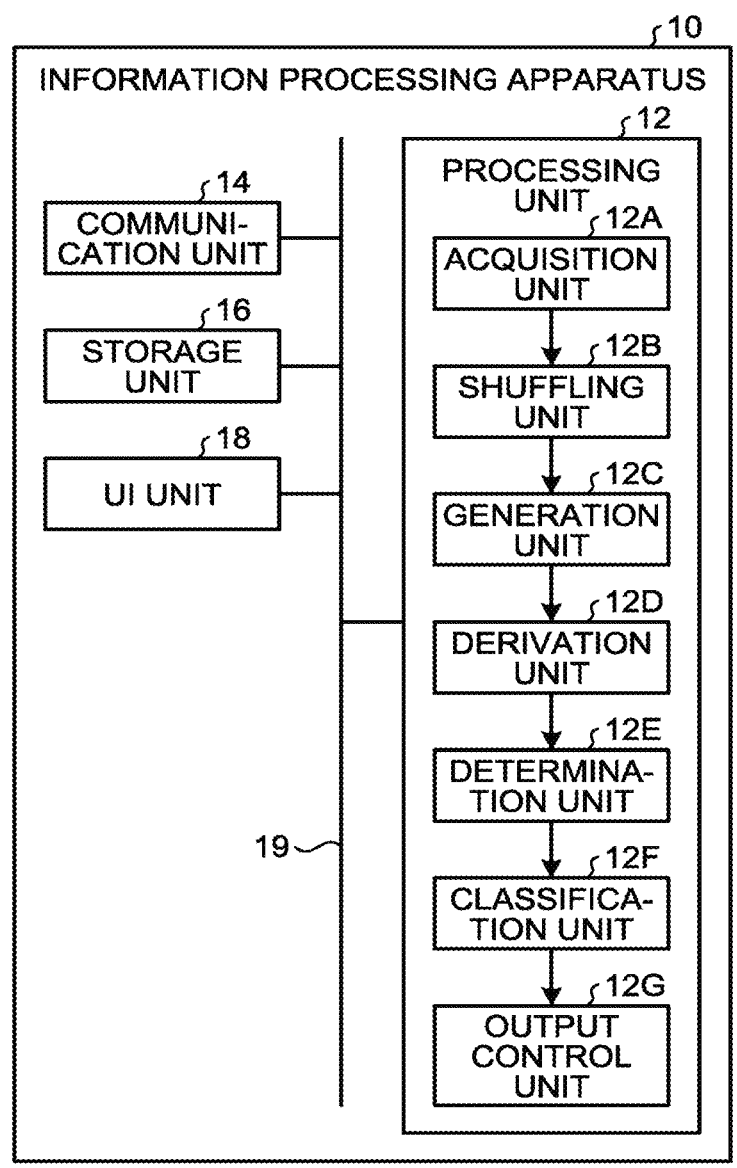
FIG. 1 is a block diagram of an information processing apparatus.

FIG. 1 is a block diagram illustrating an example of the configuration of an information processing apparatus 10 according to the present embodiment.

The information processing apparatus 10 includes a processing unit 12, a communication unit 14, a storage unit 16, and a user interface (UI) unit 18. The processing unit 12, the communication unit 14, the storage unit 16, and the UI unit 18 are connected to one another via a bus 19 so that each of the units can transfer and receive data or signals to and from another.

The communication unit 14 communicates with an external device via a wire communication network or a wireless communication network, such as a network. The storage unit 16 stores therein various kinds of data. The storage unit 16 is, for example, a semiconductor memory element such as a random access memory (RAM) or a flash memory, a hard disk, or an optical disc. The storage unit 16 may be a storage device provided outside the information processing apparatus 10. The storage unit 16 may be a storage medium. More specifically, the storage medium may be one having a program or various kinds of information downloaded thereto via a local area network (LAN) or the Internet and stored or temporarily stored therein. The storage unit 16 may be composed of a plurality of storage mediums.

The UI unit 18 includes an input mechanism that receives various instructions from a user, and a display mechanism that displays various images. The input mechanism is, for example, a keyboard, a mouse, a touch panel, or a microphone. The display mechanism is, for example, an organic electro-luminescence (EL) display, a liquid crystal display (LCD), or a projector. The UI unit 18 may be configured as a touch panel including the input mechanism and the output mechanism. The UI unit 18 may further include a speaker, which outputs sound.

Next, the processing unit 12 is described. The processing unit 12 in the information processing apparatus 10 in the present embodiment highly precisely detects whether a subject map is a subject map that has a random characteristic.

FIG. 2 is a schematic illustration illustrating examples of subject maps 20. FIG. 2 illustrates subject maps 20A to 20L as the subject maps 20.

The subject map 20 is data having subject values arrayed in N dimensions. N is an integer of 1 or more. The present embodiment is described assuming that N is 2. However, N may be 1 or an integer of 3 or more. FIG. 2 illustrates, as examples, cases in which N is 2. That is, FIG. 2 illustrates, as examples, the subject maps 20 each having subject values arrayed in two dimensions.

More specifically, when N is 2, the subject map 20 is a map in which subject values for respective positions on a two-dimensional plane are arrayed in two dimensions in accordance with the respective positions on the two-dimensional plane. The two-dimensional plane is, for example, a substrate to be subjected to processing. The substrate is, for example, a semiconductor wafer, or a hard disk drive (HDD). In such a case, positions on the substrate are, for example, the positions of a plurality of chips mounted on the semiconductor wafer.

The subject value is a value indicating a characteristic for each position on the two-dimensional plane and is expressed in the form of, for example, a numeric value.

The subject value is, more specifically, a physical characteristic value or a logical characteristic value. The physical characteristic value is expressed in the form of, for example, binary data that indicates a physical characteristic "favorable" or a physical characteristic "defective" with respect to each position on the substrate. The logical characteristic value is expressed, for example, in binary data indicating a logical characteristic "favorable" or a logical characteristic "defective" with respect to each position on the substrate. The characteristic value is not limited to binary data and may be multi-value data using three or more values. The present embodiment is described assuming that the subject value is expressed in the form of binary data that is either "0" or "1".

FIG. 2 illustrates, as examples, cases in each of which the substrate from which characteristics in the subject map 20 have been measured is a semiconductor wafer. Therefore, subject values in each of the subject maps 20 illustrated in FIG. 2 are examples of the subject values for chips mounted on a semiconductor wafer. In FIG. 2, the subject value "0" that indicates an inspection result "favorable" is illustrated in gray, and the subject value "1" that indicates an inspection result "defective" is illustrated in black.

As illustrated in FIG. 2, the distributions of the subject values in the respective subject maps 20 exhibit respective characteristic patterns.

In general, the subject maps 20 are then classified in accordance with the feature tendencies of the pattern in each of the subject maps 20. FIG. 2 illustrates examples in which these subject maps 20 have been visually classified into classes by a person and assigned labels in association with the corresponding classes.

The subject maps 20 that are subjected to the processing may include the subject map 20 that exhibits the random characteristic.

The random characteristic means an attribute such that features of a frequency domain are substantially unchanged even when the subject values on the subject map 20 are shuffled from positions to others. A condition such that a feature of a frequency domain is substantially unchanged means that the feature takes values that are deemed equal with the difference therebetween within a ±10% range of each other. For example, among the examples illustrated in FIG. 2, the subject map 20A is the subject map 20 that has the random characteristic. The subject maps 20B to 20L are examples of the subject maps 20 that have a non-random characteristic.

A conventional information processing apparatus is configured to identify feature tendencies of a plurality of subject maps 20 and classify the subject maps 20 into groups based on how similar the feature tendencies are among the subject maps 20. The subject maps 20 that exhibit the random characteristic may be classified into a classification class that is the same as those that each exhibit a relatively small number of feature tendencies. In the case of the conventional information processing apparatus, the subject map 20 that has the non-random characteristic may also be classified into the classification class of those that each exhibit a relatively small number of feature tendencies. For example, in the case of the conventional information processing apparatus, the subject map 20B, which exhibits the non-random characteristic, may be classified into the same classification class as the subject map 20A, which exhibits the random characteristic.

That is, when a conventional technique that uses feature tendencies of each of the subject maps 20 themselves as evaluation values for classification is used, it is difficult to highly precisely classify the subject maps 20 that have the random characteristic. That is, a conventional technique may fail to provide evaluation values that enable highly precise evaluation of whether the subject map 20 has the random characteristic.

The description is continued with reference to FIG. 1 again. Given the above inconvenience, the processing unit 12 in the information processing apparatus 10 in the present embodiment uses the following configuration to derive evaluation values for highly precisely evaluating whether the subject map 20 has the random characteristic. The processing unit 12 then uses the evaluation values to highly precisely classify the subject maps 20 that have the random characteristic. The processing unit 12 is described in detail.

The processing unit 12 includes an acquisition unit 12A, a shuffling unit 12B, a generation unit 12C, a derivation unit 12D, a determination unit 12E, a classification unit 12F, and an output control unit 12G.

The acquisition unit 12A, the shuffling unit 12B, the generation unit 12C, the derivation unit 12D, the determination unit 12E, the classification unit 12F, and the output control unit 12G are implemented by, for example, one or more processors. For example, the above individual units may be implemented by having a computer program executed by a processor such as a central processing unit (CPU), that is, implemented by software. The above individual units may be implemented by at least one dedicated processor, such as an integrated circuit (IC), that is, implemented by hardware. The above individual units may be implemented by a combination of software and hardware. When a plurality of processors are used, each of the processors may implement one of the individual units or may two or more of the individual units.

The acquisition unit 12A acquires the subject maps 20. For example, the storage unit 16 has the subject maps 20 previously stored therein. More specifically, for example, with respect to each previously determined category such as a kind of product and in association with the category, the storage unit 16 has the subject maps 20 that belong to the category. The acquisition unit 12A acquires the subject maps 20 by sequentially reading out from the storage unit 16, one after another, the subject maps 20 that belong to the category to be subjected to processing. The acquisition unit 12A then sequentially outputs the acquired subject maps 20 to the shuffling unit 12B.

The category that is subjected to processing may be specified by an operation instruction performed on the UI unit 18 by a user. The acquisition unit 12A may then sequentially read out, from the storage unit 16, the subject maps 20 that belong to the category to be subjected to processing in accordance with the instruction received from the UI unit 18. The acquisition unit 12A may acquire the subject maps 20 from an external device via the communication unit 14.

The shuffling unit 12B, the generation unit 12C, and the derivation unit 12D perform, each time when receiving one of the subject maps 20 from the acquisition unit 12A, the following processing using the received subject map 20.

The shuffling unit 12B generates a plurality of shuffle maps from the subject map 20. A shuffle map is a map obtained by randomly shuffling, from positions to others, at least some of the subject values contained in the subject map 20.

Figure 3A:
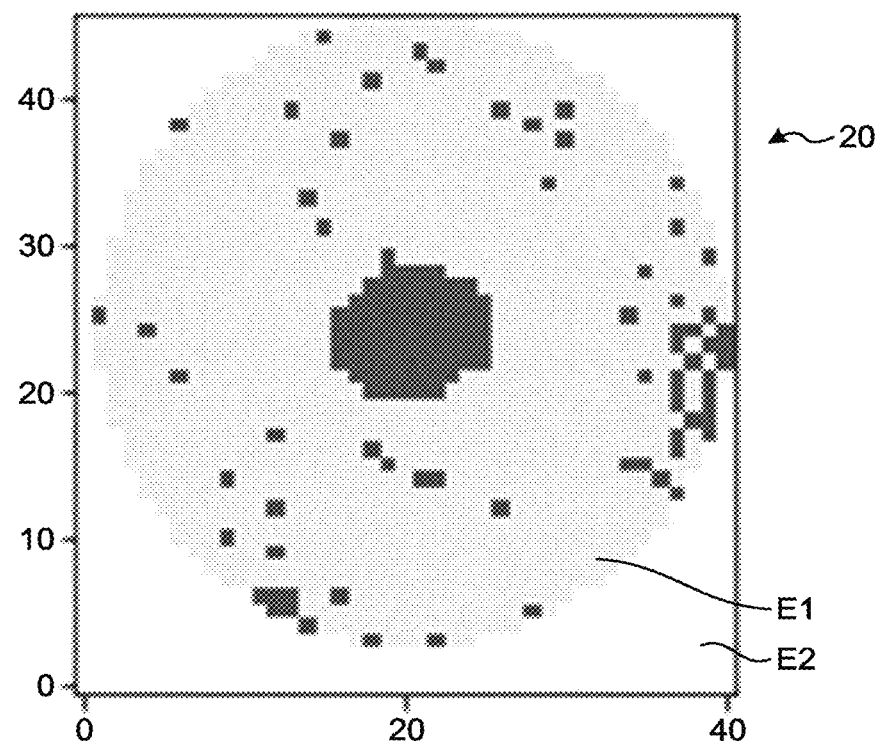
FIG. 3A is a schematic illustration of a subject map.
Figure 3B:
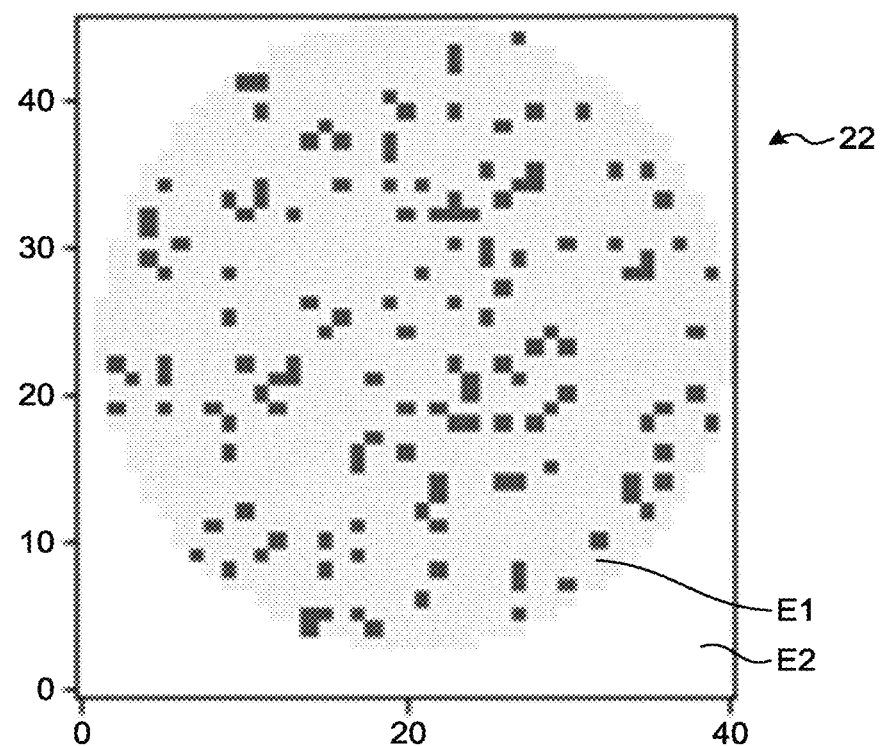
FIG. 3B is a schematic illustration of a shuffle map.

FIG. 3A and FIG. 3B are schematic illustrations of examples of one of the subject maps 20 and a shuffle map 22 generated from the one of the subject maps 20.

The shuffling unit 12B generates a plurality of shuffle maps 22 from one of the subject maps 20 by shuffling two or more of the subject values contained in the subject map 20 from positions to others for each of the shuffle maps 22. The shuffling unit 12B generates the shuffle maps 22 by performing the shuffling a plurality of times while changing at least one of the following options: the subject values to be shuffled; positions between which the subject values are shuffled; and the number of subject values to be shuffled. Changing positions between which the subject values are shuffled means changing at least one of the following options: positions in the subject map 20 from which the subject values are shuffled; and positions in the shuffle map 22 to which the subject values are shuffled. Therefore, the shuffle maps 22 are different from one another in terms of at least one of the following conditions: the subject values that have been shuffled; positions between which the subject values have been shuffled; and the number of subject values that have been shuffled.

FIG. 3B illustrates, as an example, one of the shuffle maps 22 generated from the subject maps 20.

Preferably, the shuffling unit 12B generates the shuffle maps 22 that are obtained by randomly shuffling the subject values from positions in a specific region E1 in the subject map 20 to positions within the specific region E1. The specific region E1 is a region that is in the subject map 20 and that corresponds to a region, within which subject values in the subject map 20 have been measured, on a member (for example, a substrate such as a semiconductor wafer) from which the subject values have been measured. For example, when the member from which subject values in the subject map 20 have been measured is a semiconductor wafer, as illustrated in FIG. 3A, the specific region E1 is a region that is in the subject map 20 and that has chips arrayed on the semiconductor wafer. An external region E2, which is a region in the subject map 20 other than the specific region E1, is an outer region of the semiconductor wafer.

The shuffling unit 12B may specify the specific region E1 by using the subject values contained in the subject map 20 or by using specific information for specifying the specific region E1.

For example, in the subject map 20, the shuffling unit 12B specifies, as the specific region E1, a region that has subject values that are each either the subject value "0" indicating an inspection result "favorable" or the subject value "1" indicating an inspection result "defective". In the subject map 20, the shuffling unit 12B specifies, as the external region E2, a region that has the subject values set to a null character (for example, NULL).

Alternatively, for example, with the specification information for specifying the position, the size, and the range of the specific region E1 in the subject map 20 previously stored in the storage unit 16, the shuffling unit 12B may specify the specific region E1 using the specification information.

The shuffling unit 12B may then generate a plurality of shuffle maps 22 by randomly shuffling the subject values from positions within the specific region E1 in the subject map 20 to positions within the specific region E1 (see FIGS. 3A and 3B).

The shuffling unit 12B shuffles the subject values within the specific region E1, which makes it possible to avoid placing the subject values in the specific region E1 in the external region E2, which is a region within which the subject values originally are not present. Therefore, either or both of the precision of determination by the determination unit 12E described later or the precision of classification by the classification unit 12F can be further enhanced.

The number of shuffle maps 22 generated by the shuffling unit 12B from one of the subject maps 20 only needs to be two or more and is not limited. The number of shuffle maps 22 may be determined previously. That is, the number of times the shuffling unit 12B performs the shuffling in each one of the subject maps 20 only needs to be two or more and may be previously determined.

However, it is preferable that the number of times the shuffling is performed is larger. As the number of times the shuffling is performed is larger, that is, as the number of shuffle maps 22 the shuffling unit 12B generates from one of the subject maps 20 is larger, the precision of classification by the classification unit 12F described later can be higher.

Figure 4:
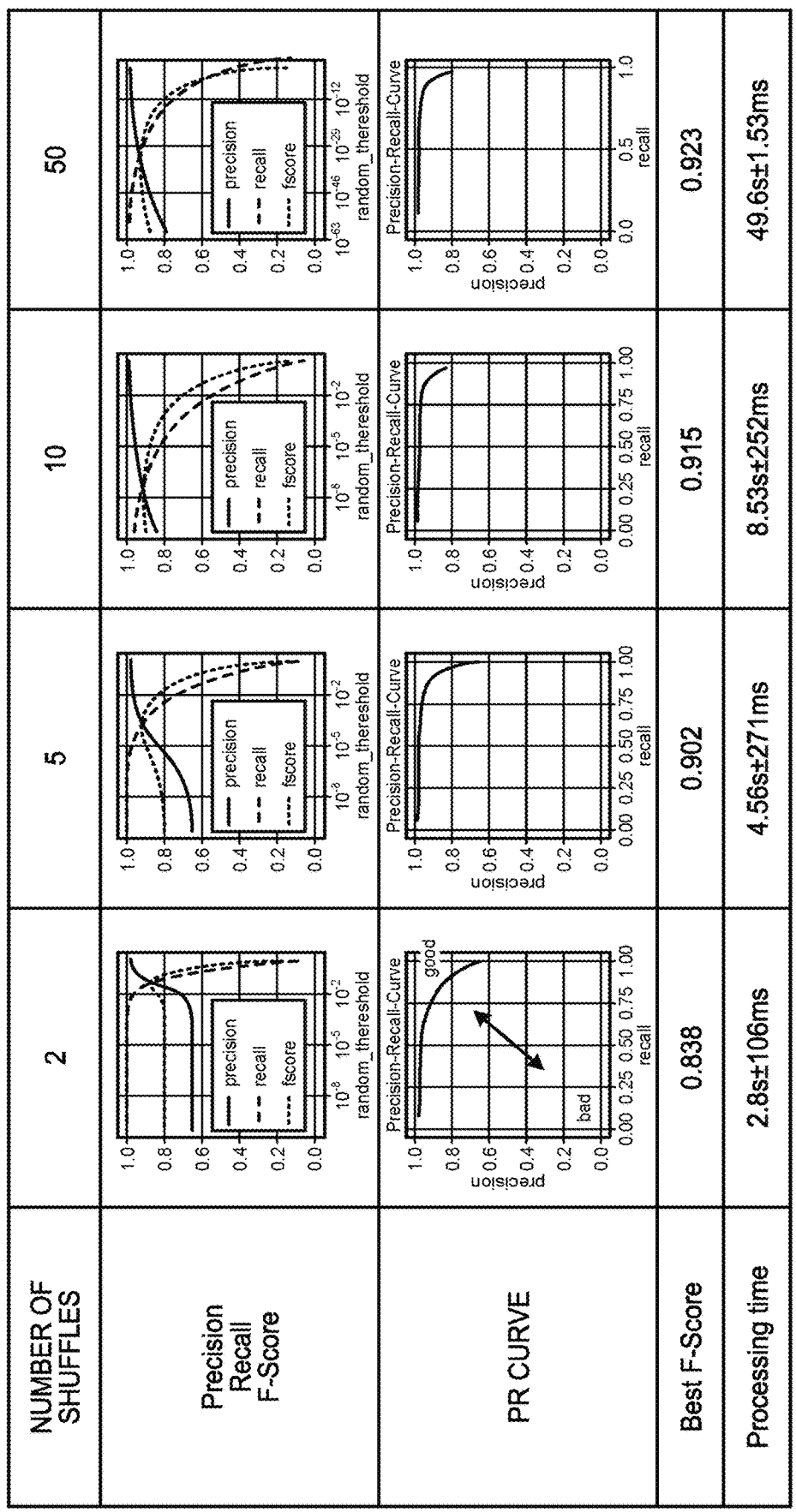
FIG. 4 illustrate schematic illustrations each illustrating a simulation result for the relation between the number of times shuffling is performed and classification precision.

FIG. 4 illustrates schematic illustrations each illustrating an example of a simulation result for the relation between the number of times the shuffling is performed and classification precision. FIG. 4 illustrates precision-recall (PR) curves that are curves indicating the performances of evaluation indices on the category with respect to the different numbers of times the shuffling is performed. A PR curve is a graph in which precision and recall are plotted against the axes. As illustrated in FIG. 4, the F-score, which is the mean of precision and recall and an evaluation indices for a classification result, has a larger value as the number of times the shuffling is performed is larger.

Therefore, it is more preferable if the number of shuffle maps 22 generated by the shuffling unit 12B from one of the subject maps 20 is larger. In consideration of reduction in the processing load on the processing unit 12, however, it is preferable that the upper limit value of the number of times the shuffling is performed be determined in accordance with the processing capability of the processing unit 12.

The description is continued with reference to FIG. 1 again. Next, the generation unit 12C is described.

The generation unit 12C generates a subject vector from one of the subject maps 20. The subject vector is a vector that indicates features of a frequency domain in the one of the subject maps 20. The generation unit 12C also generates a random vector with respect to each of the shuffle maps 22 generated from the one of the subject map 20. A random vector is a vector expressing features of the respective frequency domains of the shuffle maps 22.

Figure 5A:
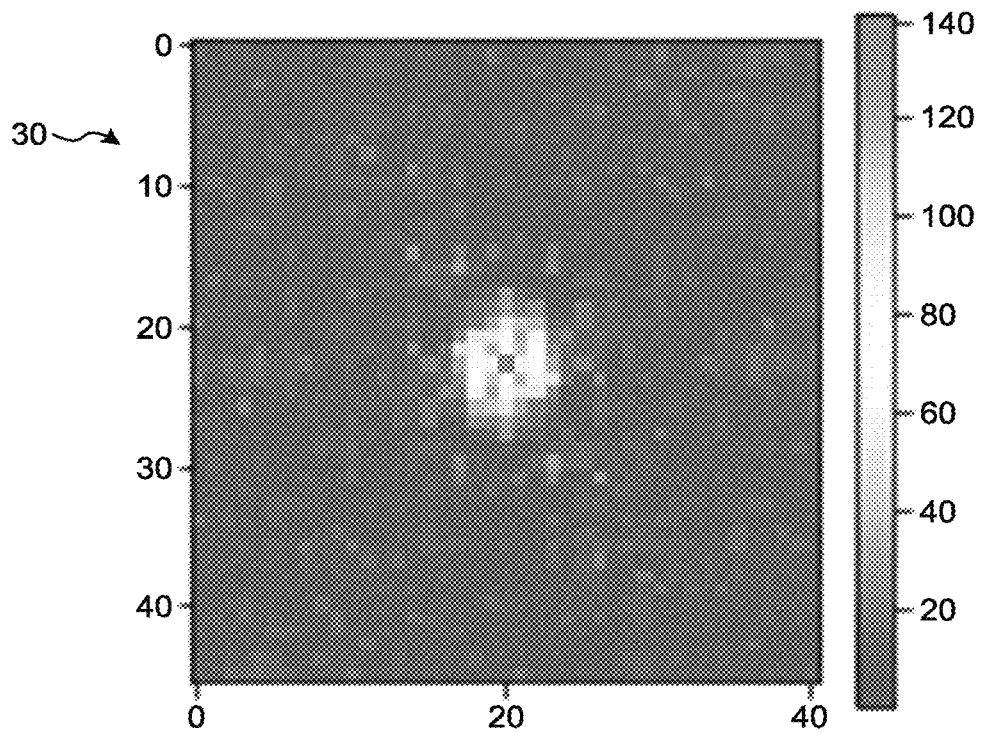
FIG. 5A is a schematic illustration of a subject vector.
Figure 5B:
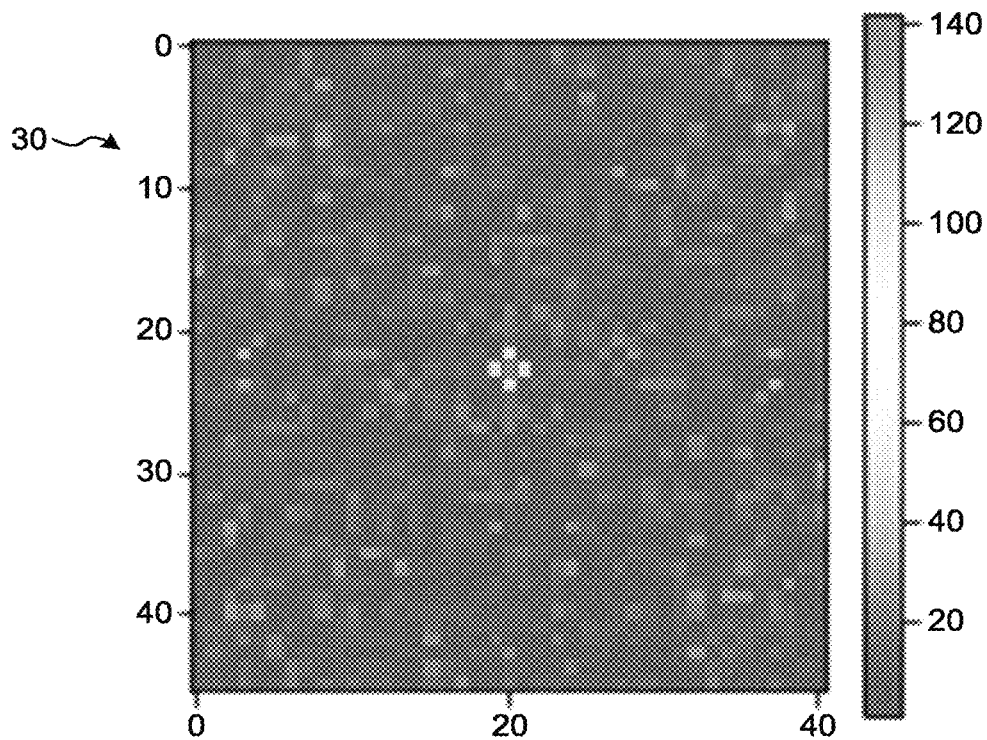
FIG. 5B is a schematic illustration of a random vector.

FIGS. 5A and 5B are schematic illustrations illustrating examples of the subject vector 30 and the random vector 32. The subject vector 30 illustrated in FIG. 5A is an example of the subject vector 30 generated from the subject map 20 illustrated in FIG. 3A. The random vector 32 illustrated in FIG. 5B is an example of the random vector 32 generated from the shuffle map 22 illustrated in a FIG. 3B.

A vector that expresses the features of a frequency domain is, for example, a frequency spectrum, a power spectral density, or an autocorrelation function. That is, the subject vector 30 and the random vector 32 are, for example, frequency spectra, power spectral densities, or autocorrelation functions.

The generation unit 12C may generate the subject vector 30 and the random vector 32 by transforming the subject map 20 and each of the shuffle maps 22 into respective frequency domains using Fourier transform, cosine transform, wavelet conversion, or the like.

The description is continued with reference to FIG. 1 again. Next, the derivation unit 12D is described.

The derivation unit 12D calculates a feature difference, which is the difference between the subject vector 30 and each of the random vectors 32. The derivation unit 12D executes test processing that is statistical hypothesis testing on the feature differences thus calculated and thereby derives a testing result. The derivation unit 12D derives this testing result as an evaluation value on whether the subject map 20 has the random characteristic.

The derivation unit 12D uses the feature differences as a population for the statistical hypothesis testing. A feature difference is a difference in the features of the respective frequency domains between the subject vector 30 and the random vector 32. The derivation unit 12D calculates, with respect to each pair of the subject vector 30 and one of the random vectors 32, the feature difference between the subject vector 30 and the one of the random vectors 32.

FIGS. 6A, 6B, 7A, 7B, and 8 are illustrations explaining an example of calculation of a feature difference 34.

Figure 6A:
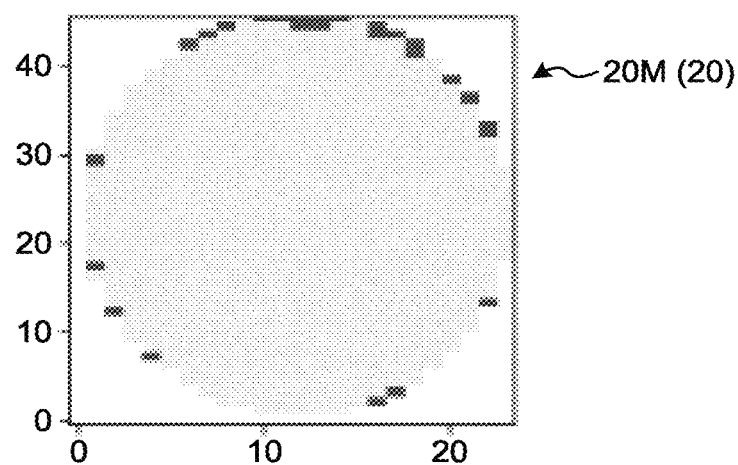
FIG. 6A is an illustration explaining calculation of a feature difference.
Figure 6B:
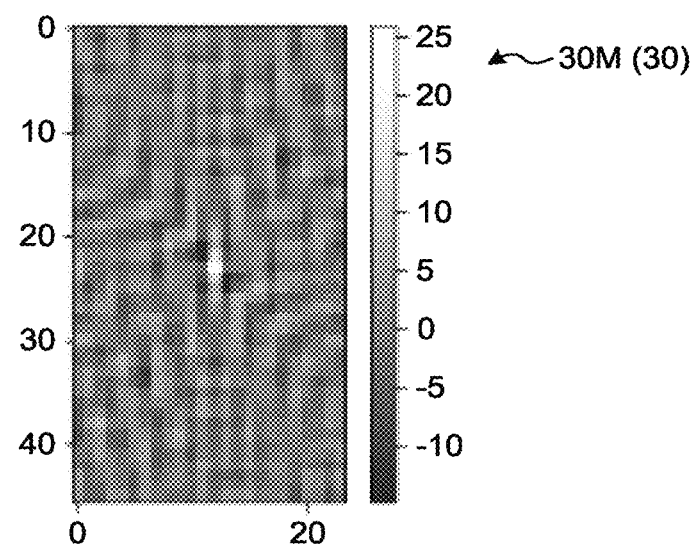
FIG. 6B is an illustration explaining the calculation of the feature difference.

FIG. 6A is a schematic illustration illustrating a subject map 20M. The subject map 20M is an example of the subject map 20. FIG. 6B is a schematic illustration illustrating a subject vector 30M generated from the subject map 20M. The subject vector 30M is an example of the subject vector 30.

Figure 7A:
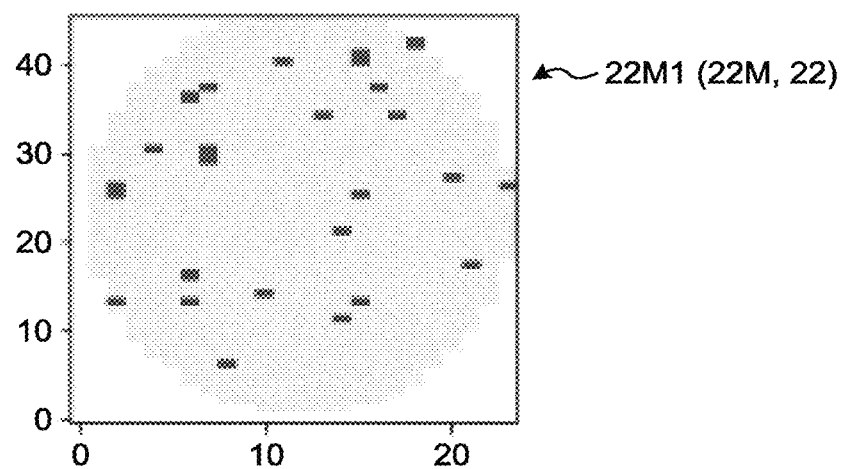
FIG. 7A is an illustration explaining the calculation of the feature difference.
Figure 7B:
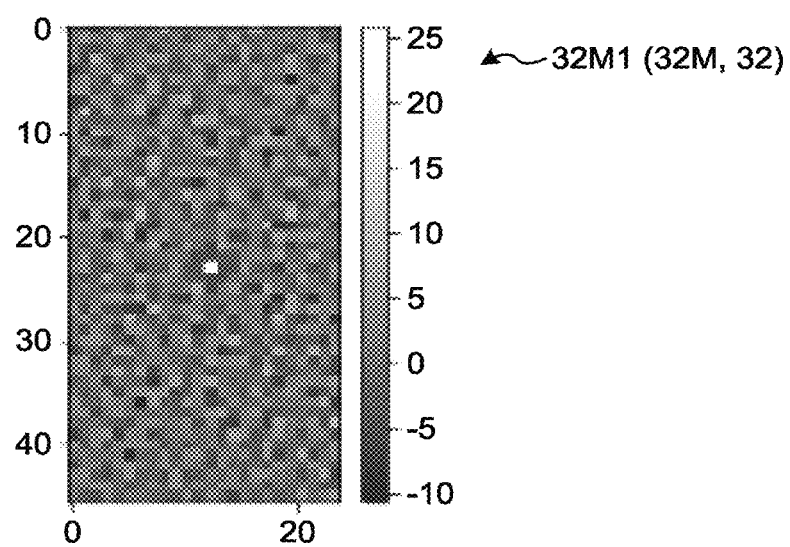
FIG. 7B is an illustration explaining the calculation of the feature difference.

FIG. 7A is a schematic illustration illustrating a shuffle map 22M1 generated from the subject map 20M. The shuffle map 22M1 is one among a plurality of shuffle maps 22M generated from the subject map 20M. The shuffle map 22M is an example of the shuffle map 22. FIG. 7B is a schematic illustration illustrating a random vector 32M1 generated from the shuffle map 22M1. The random vector 32M1 is an example of the random vector 32.

Figure 8:
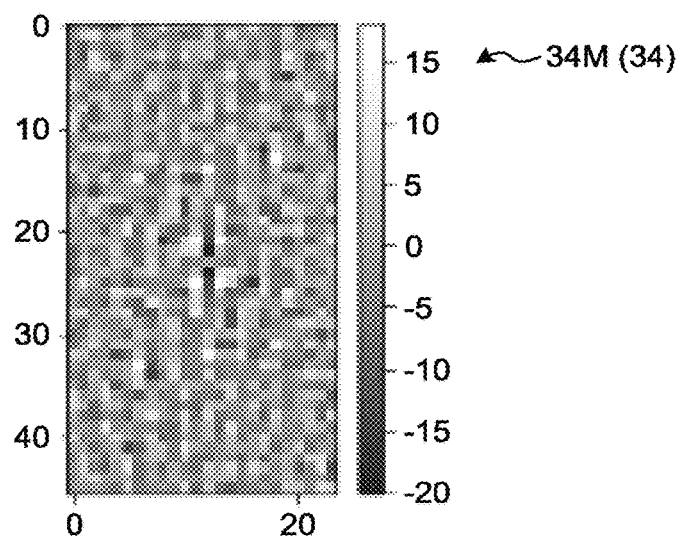
FIG. 8 illustrates an example of the difference in features.

FIG. 8 illustrates an example of the difference in the features between the subject vector 30M and the random vector 32M1. A feature difference 34M is an example of the feature difference 34.

As illustrated in FIGS. 6A to 7B, the derivation unit 12D calculates the differences in the features at the same positions with respect to the pair of the subject vector 30M and the random vector 32M1. The features are features of a frequency domain. The same positions mean that positions on a member (for example, a semiconductor wafer) on which measurement is performed for the subject map 20M are the same. The derivation unit 12D then calculates, as the feature difference 34M, the mean value of the differences in the features between the subject vector 30M and the random vector 32M1 at the respective positions (see FIG. 8).

Here, as described above, the random characteristic means an attribute such that features of a frequency domain are substantially unchanged even when the subject values on the subject map 20 are shuffled from positions to others. Therefore, it can be argued that the probability that the subject map 20 has the random characteristic is higher as the feature difference 34 between the subject map 20 that exhibits the random characteristic and the shuffle map 22 generated from the subject map 20 is smaller. In contrast, it can be argued that the probability that the subject map 20 has the random characteristic is lower as the feature difference 34 is larger.

Thus, the derivation unit 12D performs statistical hypothesis testing using, as the population for the statistical hypothesis testing, the feature differences 34 each calculated for the subject map 20 and one of the random vectors 32. The derivation unit 12D then derives the testing result of the statistical hypothesis testing as an evaluation value for whether the random characteristic is exhibited.

More specifically, the derivation unit 12D uses a t-test or a Wilcoxon signed-rank test for the statistical hypothesis testing.

When a t-test is used for the statistical hypothesis testing, the derivation unit 12D performs, on the feature differences 34 derived from a plurality of pairs of the subject vector 30 and the respective random vectors 32, test processing that is a t-test with a null hypothesis that the partial regression coefficient is not 0. The derivation unit 12D then derives, as the testing result, the t-value or the p-value of the t-test.

When a Wilcoxon signed-rank test is used for the statistical hypothesis testing, the derivation unit 12D performs, on the feature differences 34 derived from the above pairs, test processing that is a Wilcoxon signed-rank test. The derivation unit 12D then derives, as the testing result, the statistic value or the p-value of the Wilcoxon signed-rank test.

The description is continued with reference to FIG. 1 again. The determination unit 12E determines, based on the testing result, whether the subject map 20 used for deriving the testing result is a map that has the random characteristic.

For example, the determination unit 12E determines, when the testing result is equal to or more than a threshold, that the subject map 20 has the random characteristic, and determines, when the testing result is less than the threshold, that the subject map 20 has the non-random characteristic. That is, the determination unit 12E uses the testing result to determine whether there is a significant difference between the subject vector 30 and the random vectors 32. The determination unit 12E then determines, when there is a significant difference therebetween, that the subject map 20 has the random characteristic, and determines, when there is no significant difference therebetween, that the subject map 20 has the non-random characteristic.

This threshold may be previously determined.

For example, the determination unit 12E may determine the threshold in accordance with the number of times the subject map 20 used for deriving the testing result is shuffled. For example, the determination unit 12E may determine the threshold using the following formula (1).

$$\text{Threshold} = \alpha^M \quad (1)$$

In formula (1), $\alpha$ is a parameter for adjusting a detection intensity and is a value that satisfies $0<\alpha<1$. The value of $\alpha$ may be adjusted in accordance with the purpose. As the value of $\alpha$ is smaller, the determination by the determination unit 12E is more likely to result in "random defect". M indicates the number of times the shuffling is performed.

As the number of times the shuffling is performed is larger, that is, as the number of shuffle maps 22 generated from one of the subject maps 20 is larger, the above t-value, which is an example of the testing result, has a smaller value. Therefore, the determination unit 12E uses formula (1) above to determine the threshold that depends on the number of times the shuffling is performed, whereby the precision of determination as to whether the subject map 20 has the random characteristic can be enhanced.

Alternatively, for example, the determination unit 12E may determine the threshold from statistic values obtained as the testing results for the respective subject maps 20.

The determination unit 12E may use the following method to determine whether the subject map 20 has the random characteristic.

For example, the determination unit 12E lines up the testing results for the subject maps 20 that belong to the category subjected to the processing, in descending order of corresponding evaluation values. The determination unit 12E then determines that the subject maps 20 that correspond to a predetermined number of testing results that corresponds to the highest evaluation values are those having the random characteristic. The determination unit 12E may then determine the subject maps 20, other than the subject maps 20 that have been determined to have the random characteristic, to have the non-random characteristic.

Figure 9:
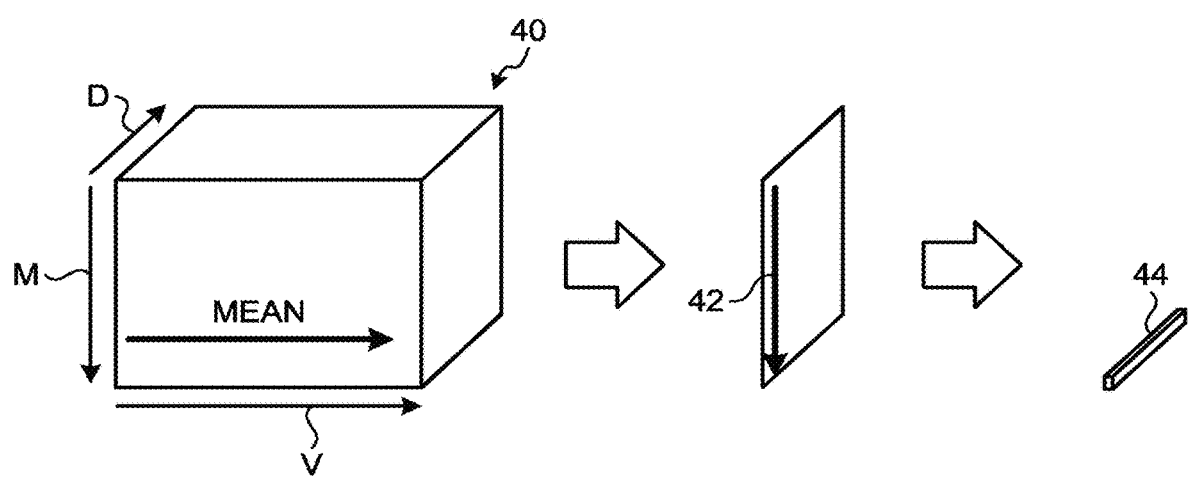
FIG. 9 is an illustration explaining the procedure of determination as to whether a random characteristic is exhibited.

FIG. 9 is an illustration explaining the procedure for determination by the processing unit 12 as to whether the random characteristic is exhibited.

The shuffling unit 12B, the generation unit 12C, and the derivation unit 12D executes the above processing with respect to each of the subject maps 20 that belongs to a category to be subjected to the processing. Therefore, there has been a state in which a tensor 40 has been generated. The tensor 40 is, for example, a tensor of D×M×V. P is the number of subject maps 20 that belong to the category to be subjected to the processing. P corresponds to, for example, the number of semiconductor wafers. M is the number of times the shuffling is performed. V is a vector of the feature differences 34.

The derivation unit 12D then executes, by using a matrix 42 with respect to each of the subject maps 20, test processing that is statistical hypothesis testing, whereby a testing result 44 is obtained. The matrix 42 is a matrix expression of the mean values of the differences in the features of the subject vector 30 and the respective random vectors 32 for each position.

The determination unit 12E then uses the testing result 44 to determine whether the subject map 20 has the random characteristic.

The description is continued with reference to FIG. 1 again. Next, the classification unit 12F is described. After the acquisition unit 12A, the shuffling unit 12B, the generation unit 12C, the derivation unit 12D, and the determination unit 12E determine whether each of the subject maps 20 that belong to the category subjected to the processing has the random characteristic or the non-random characteristic, the classification unit 12F executes classification processing.

The classification unit 12F classifies the subject maps 20 that have been determined to have the non-random characteristic among the subject maps 20 that belong to the category subjected to the processing, based on the distances in the features between the subject maps 20 or based on the degrees of similarity between the subject maps 20. A publicly known method may be used as a method for this classification.

The processing is then in a state in which highly precise determination as to whether each of the subject maps 20 has the random characteristic has been performed by the acquisition unit 12A, the shuffling unit 12B, the generation unit 12C, the derivation unit 12D, and the determination unit 12E. Therefore, the classification unit 12F classifies the subject maps 20 that have been determined to have the non-random characteristic and thus can highly precisely classify the subject maps 20 that have the non-random characteristic. In other words, the classification unit 12F can avoid classifying, as those having the non-random characteristic, the subject maps 20 having the random characteristic. The classification unit 12F can also avoid classifying, as the subject maps 20 having the random characteristic, the subject maps 20 having the non-random characteristic.

The classification unit 12F outputs a classification result to the output control unit 12G. The classification result is, for example, the subject maps 20 that have been classified, the numbers of subject maps 20 in the respective classification classes, and the like. The classification result may contain statistic information derived from at least one of the following set of maps: the subject maps 20 that have the non-random characteristic; and the subject maps 20 that have the random characteristic. Examples of the statistic information include: the number of subject maps 20 having the non-random characteristic; the number of subject maps 20 that have the random characteristic; the distribution of proportions of defectives; the mean proportion of defectives; the degree of impact on the yield from the subject maps 20 having the random characteristic; and the degree of impact on the yield from the subject maps 20 having the non-random characteristic. The classification unit 12F may derive these classification results using a predetermined function, a leaning model, or the like. For example, by deriving the degree of impact on the yield from the subject maps 20 having the random characteristic, the classification unit 12F can derive a more precise degree of impact on the yield from the subject maps 20 having the non-random characteristic, exclusive of impact thereon from the subject maps 20 having the random characteristic.

The output control unit 12G outputs, to the UI unit 18, at least one of: the testing result derived by the derivation unit 12D; the determination result from the determination unit 12E; and the classification result from the classification unit 12F. The output control unit 12G may transmit to an external device, via the communication unit 14, at least one of: the testing result derived by the derivation unit 12D; the determination result from the determination unit 12E; and the classification result from the classification unit 12F. The output control unit 12G provides a user with the testing result derived by the derivation unit 12D, the determination result from the determination unit 12E, and the classification result from the classification unit 12F.

Next, an example of the procedure of information processing that the information processing apparatus 10 executes is described.

Figure 10:
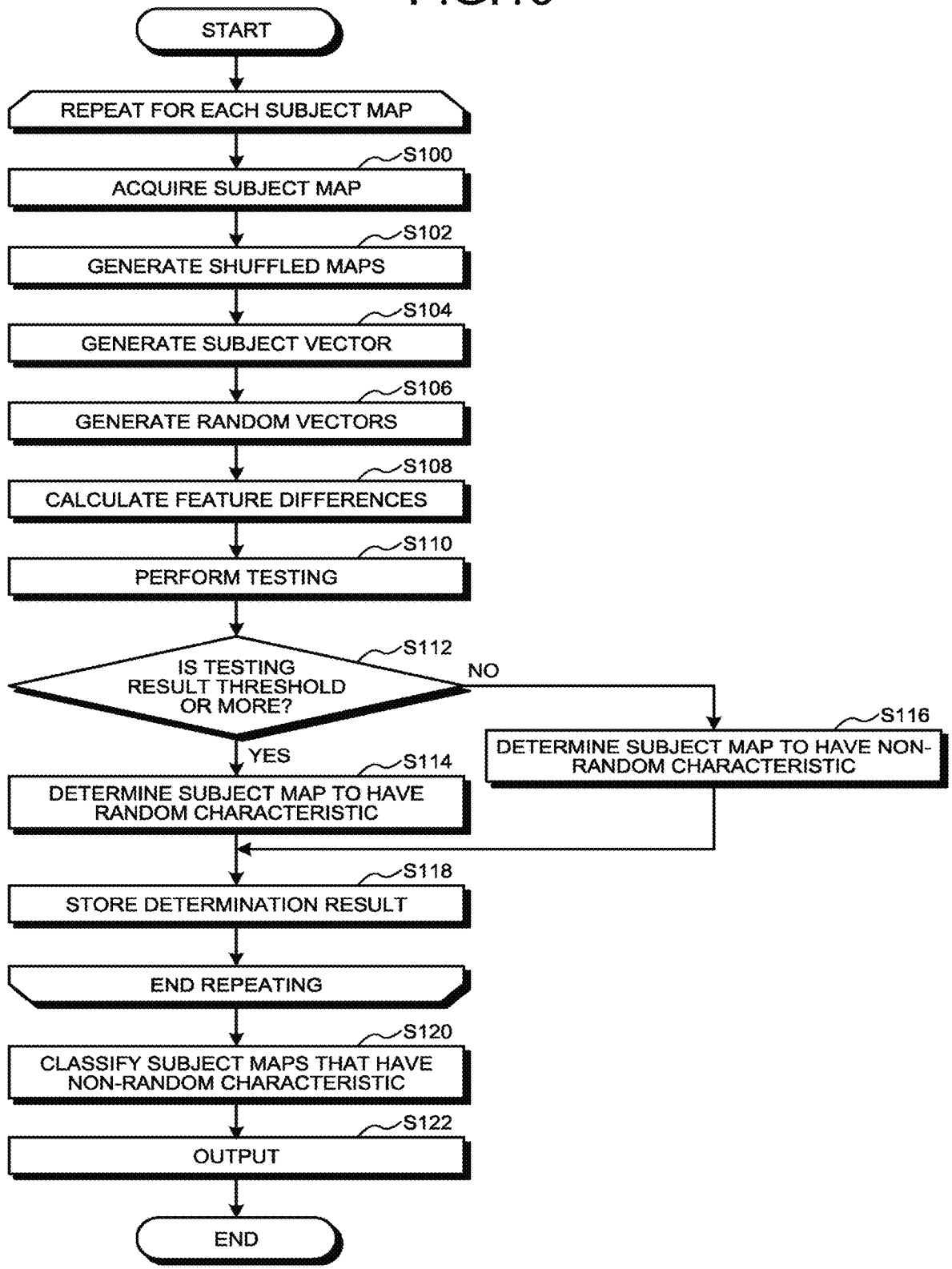
FIG. 10 is a flowchart illustrating the procedure of information processing.

FIG. 10 is a flowchart illustrating an example of the procedure of information processing that the information processing apparatus 10 executes. The processing unit 12 in the information processing apparatus 10 repeats executing processing at steps S100 to S118 on each of the subject maps 20.

More specifically, the acquisition unit 12A in the processing unit 12 acquires one of the subject maps 20 to be subjected to the processing (step S100).

The shuffling unit 12B generates the shuffle maps 22 from the subject map 20 acquired at step S100 (step S102).

Subsequently, the generation unit 12C generates the subject vector 30 of the subject map 20 acquired at step S100 (step S104). The generation unit 12C then generates the random vector 32 with respect to each of the shuffle maps 22 generated at step S102 (step S106).

Subsequently, the derivation unit 12D calculates the feature differences 34 between the subject vector 30 generated at step S104 and the respective random vectors 32 generated at step S106 (step S108).

Subsequently, using the feature differences 34 calculated at step S108, the derivation unit 12D executes test processing that is statistical hypothesis testing (step S110). The testing result of the test processing is derived through the processing at step S110.

Subsequently, the determination unit 12E determines whether the testing result derived at step S110 is equal to or more than the threshold (step S112).

If the testing result is determined to be equal to or more than the threshold (Yes at step S112), the processing is shifted to step S114. At step S114, the determination unit 12E determines that the subject map 20 acquired at step S100 has the random characteristic (step S114). The processing is then shifted to step S118.

In contrast, if the testing result is determined to be less than the threshold (No at step S112), the processing is shifted to step S116. At step S116, the determination unit 12E determines that the subject map 20 acquired at step S100 has the non-random characteristic (step S116). The processing is then shifted to step S118.

At step S118, the determination result at steps S112 to S116 are stored in the storage unit 16 in association with the subject map 20 acquired at step S100 (step S118).

After the processing at steps S100 to S118 is performed on each of the subject maps 20, the classification unit 12F classifies the subject maps 20 that have been determined to have the non-random characteristic, based on the distances of the features between these subject maps 20 or based on the degrees of similarity between these subject maps 20 (step S120). The classification unit 12F may assign a label to the subject maps 20 that belong to each classification class obtained by the classification.

Next, the output control unit 12G outputs, to the UI unit 18, at least one of the following: the testing result at step S110; the determination result at steps S112 to S116; and the classification result at step S120 (step S122). This ends the present routine.

As described above, the information processing apparatus 10 in the present embodiment includes the shuffling unit 12B, the generation unit 12C, and the derivation unit 12D. The shuffling unit 12B generates a plurality of shuffle maps 22 by randomly shuffling, from positions to others, at least some of subject values contained in the subject map 20, which has the subject values arrayed in N dimensions (N is an integer of 1 or more). The generation unit 12C generates the subject vector 30 expressing the features of a frequency domain in the subject map 20 and the random vectors 32 expressing the features of respective frequency domains in the shuffle maps 22. The derivation unit 12D derives, as an evaluation values for whether the subject map 20 has the random characteristic, the testing result 44 of the statistical hypothesis testing on the feature differences 34 between the subject vector 30 and the respective random vectors 32.

As described above, the information processing apparatus 10 in the present embodiment does not derive the features or the feature tendencies the subject map 20 itself as an evaluation value for whether subject map 20 has the random characteristic. Instead, the information processing apparatus 10 derives the testing result 44 derived using the subject map 20 and the shuffle maps 22 generated from the subject map 20.

Here, as described above, the random characteristic means an attribute such that features of a frequency domain are substantially unchanged even when the subject values on the subject map 20 are shuffled from positions to others. Therefore, it can be argued that the probability that the subject map 20 has the random characteristic is higher as the feature difference 34 between the subject map 20 that exhibits the random characteristic and the shuffle map 22 generated from the subject map 20 is smaller. It can also be argued that the probability that the subject map 20 has the random characteristic is lower as the feature difference 34 is larger.

Therefore, the information processing apparatus 10 in the present embodiment derives the testing result 44 using the subject map 20 and the shuffle maps 22 and thus can derive evaluation values that enable highly precise evaluation of whether the subject map 20 has the random characteristic.

The information processing apparatus 10 in the present embodiment thus can provide evaluation values that enable highly precise evaluation of whether the subject map 20 has the random characteristic.

In the information processing apparatus 10 in the present embodiment, the determination unit 12E uses the testing result 44 to determine whether the random characteristic is exhibited. Therefore, the determination unit 12E can highly precisely determine whether the subject map 20 has the random characteristic.

In the information processing apparatus 10 in the present embodiment, the classification unit 12F classifies the subject maps 20 that have been determined by the determination unit 12E to have the non-random characteristic. Therefore, the classification unit 12F is enabled to classify the subject maps 20 that have been highly precisely determined to have the non-random characteristic, whereby the precision of the classification can be enhanced.

Next, an example of the hardware configuration of the information processing apparatus 10 in the above embodiment is described.

Figure 11:
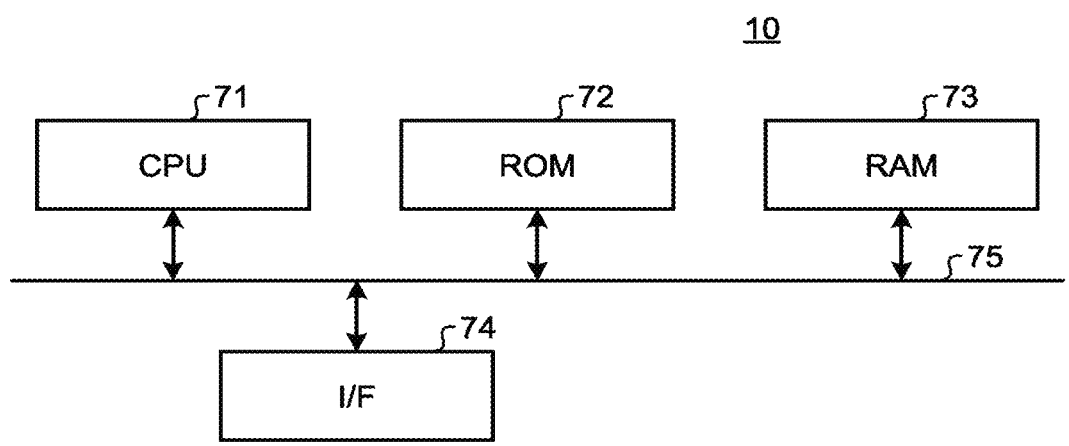
FIG. 11 is a hardware configuration diagram.

FIG. 11 is an example of the hardware configuration diagram of the information processing apparatus 10 in the above embodiment.

The information processing apparatus 10 in the above embodiment has a hardware configuration using an ordinary computer in which a central processing unit (CPU) 71, a read only memory (ROM) 72, a random access memory (RAM) 73, and an interface (I/F) 74 are connected to one another via the bus 75.

The CPU 71 is an arithmetic unit that controls the information processing apparatus 10 in the above embodiment. The ROM 72 stores therein a program and the like for implementing various kinds of processing by the CPU 71. The RAM 73 stores therein data needed for various kinds of processing by the CPU 71. The I/F 74 is an interface for transmitting and receiving data by being connected to units such as the communication unit 14 and the UI unit 18.

In the information processing apparatus 10 in the above embodiment, the CPU 71 reads a program out from the ROM 72 onto the RAM 73 and executes the program, whereby the above individual functions are implemented on a computer.

A program for executing any of the above individual parts of processing to be executed in the information processing apparatus 10 in the above embodiment and may be stored in a hard disk drive (HDD). A program for executing any of the above individual parts of processing to be executed in the information processing apparatus 10 in the above embodiment may be provided by being previously embedded in the ROM 72.

A program for executing any of the above individual parts of processing to be executed in the information processing apparatus 10 in the above embodiment may be provided as a computer program product by being stored as a file of an installable format or an executable format in a computer-readable storage medium such as a compact disc read only memory (CD-ROM), compact disc recordable (CD-R), a memory card, digital versatile disc (DVD), or a flexible disk (FD). A program for executing any of the above individual parts of processing to be executed in the information processing apparatus 10 in the above embodiment may be stored on a computer connected to a network such as the Internet and be provided by being downloaded via the network. A program for executing any of the above individual parts of processing to be executed in the information processing apparatus 10 in the above embodiment may be provided or distributed via a network such as the Internet.

While a certain embodiment has been described, the embodiment has been presented by way of example only, and are not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. An information processing apparatus comprising:
   a user interface; and
   one or more processors configured to:
      generate a plurality of shuffle maps obtained by randomly shuffling, from positions to others, at least some of subject values contained in a subject map having the subject values arrayed in N dimensions, wherein N is an integer of 1 or more, and wherein the subject map is a map in which the subject values for respective positions on an N-dimensional plane are arrayed in the N dimensions in accordance with the respective positions on the N-dimensional plane, and the N-dimensional plane is a semiconductor wafer;
      generate a subject vector and random vectors, the subject vector expressing features of a frequency domain of the subject map, the random vectors expressing features of respective frequency domains of the shuffle maps;
      derive, as an evaluation value for whether the subject map has a random characteristic, a testing result of statistical hypothesis testing on feature differences between the subject vector and the respective random vectors; and
      display, via the user interface, the testing result of the statistical hypothesis testing on the feature differences between the subject vector and the respective random vectors.

2. The apparatus according to claim 1, wherein the subject map is data in which the subject values that are characteristic values of a plurality of chips mounted on the semiconductor wafer are arrayed in two dimensions in accordance with positions of the chips on the semiconductor wafer.

3. The apparatus according to claim 1, wherein the processors are further configured to generate the shuffle maps obtained by randomly shuffling the subject values from positions within a specific region in the subject map to others within the specific region.

4. The apparatus according to claim 1, wherein the subject vector and the random vectors are frequency spectra, power spectral densities, or autocorrelation functions.

5. The apparatus according to claim 1, wherein, from the feature differences between the subject vector and the respective random vectors, the processors are further configured to derive the testing result that is a t-value or a p-value of a t-test with a null hypothesis that a partial regression coefficient is not zero.

6. The apparatus according to claim 1, wherein, from the feature differences between the subject vector and the respective random vectors, the processors are further configured to derive the testing result that is a statistic or a p-value of a Wilcoxon signed-rank test.

7. The apparatus according to claim 1, wherein the processors are further configured to, when the testing result is equal to or more than a threshold, determine the subject map to have the random characteristic and, when the testing result is less than the threshold, determine the subject map to have a non-random characteristic.

8. The apparatus according to claim 7, wherein the processors are further configured to classify the subject maps determined to have the non-random characteristic among a plurality of the subject maps, based on distances in features of the subject maps or based on degrees of similarity between the subject maps.

9. The apparatus according to claim 1, wherein the processors are further configured to line up testing results for a plurality of the subject maps in descending order of the corresponding evaluation values, determine some of the subject maps to have the random characteristic, and determine other subject maps of the subject maps to have a non-random characteristic, the some being maps corresponding to a predetermined number of testing results that have the higher evaluation values in the descending order.

10. The apparatus according to claim 9, wherein the processors are further configured to classify the subject maps determined to have the non-random characteristic among a plurality of the subject maps, based on distances in features of the subject maps or based on degrees of similarity between the subject maps.

11. An information processing method to be executed by a computer, the information processing method comprising:
    generating a plurality of shuffle maps obtained by randomly shuffling, from positions to others, at least some of subject values contained in a subject map having the subject values arrayed in N dimensions, wherein N is an integer of 1 or more, and wherein the subject map is a map in which the subject values for respective positions on an N-dimensional plane are arrayed in the N dimensions in accordance with the respective positions on the N-dimensional plane, and the N-dimensional plane is a semiconductor wafer;
    generating a subject vector and random vectors, the subject vector expressing features of a frequency domain of the subject map, the random vectors expressing features of respective frequency domains of the shuffle maps;
    deriving, as an evaluation value for whether the subject map has a random characteristic, a testing result of statistical hypothesis testing on feature differences between the subject vector and the respective random vectors; and displaying, via a user interface, the testing result of the statistical hypothesis testing on the feature differences between the subject vector and the respective random vectors.

* * * * *